United States Patent
Yu

(10) Patent No.: US 9,620,735 B2
(45) Date of Patent: Apr. 11, 2017

(54) METHOD FOR PACKAGING THE OLED DISPLAY PANEL USING SCREEN PRINTING

(71) Applicant: Shenzhen China Star Optoelectronics Technology Co., Ltd., Shenzhen, Guangdong (CN)

(72) Inventor: Wei Yu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 14/769,794

(22) PCT Filed: Jul. 22, 2015

(86) PCT No.: PCT/CN2015/084775
§ 371 (c)(1),
(2) Date: Aug. 21, 2015

(65) Prior Publication Data
US 2017/0012236 A1    Jan. 12, 2017

(30) Foreign Application Priority Data
Jul. 7, 2015 (CN) .......................... 2015 1 0395187

(51) Int. Cl.
*H01L 51/52* (2006.01)
*H01L 51/56* (2006.01)

(52) U.S. Cl.
CPC ........ *H01L 51/5246* (2013.01); *H01L 51/525* (2013.01); *H01L 51/56* (2013.01); *H01L 51/524* (2013.01)

(58) Field of Classification Search
CPC ... H01L 51/5246; H01L 51/525; H01L 51/56; H01L 51/524
See application file for complete search history.

(56) References Cited

U.S. PATENT DOCUMENTS

| 2009/0170230 A1* | 7/2009 | Kidu | H01L 27/3211 438/35 |
| 2012/0268005 A1* | 10/2012 | Furihata | H01L 27/3283 313/504 |
| 2014/0209928 A1* | 7/2014 | Teng | H01L 25/0753 257/82 |

* cited by examiner

*Primary Examiner* — Thanh V Pham
(74) *Attorney, Agent, or Firm* — Andrew C. Cheng

(57) ABSTRACT

A method for packaging an organic light-emitting diode (OLED) display panel includes: providing a package cover and an OLED substrate, and an OLED device arranged on OLED substrate; simultaneously printing a circle of a support and a hydrophobic barricade on an outer side of the package cover corresponding to the OLED device by means of screen printing, the support printed on an outer side of the hydrophobic barricade; and cementing the package cover and the OLED substrate. The hydrophobic barricade can effectively prevent external water vapor and oxygen from touching the OLED device. Therefore, the effect of package is enhanced, and the lifetime of the OLED device is prolonged. Further, the support and the hydrophobic barricade are formed at the same time through screen printing. Not only the method is simple but the efficiency is enhanced.

10 Claims, 2 Drawing Sheets

METHOD FOR PACKAGING THE OLED DISPLAY PANEL USING SCREEN PRINTING

BACKGROUND OF THE INVENTION

1. Field of the Invention

The present invention relates to the field of display technology, and more particularly, to an organic light-emitting diode (OLED) display panel and a method for packaging the same.

2. Description of the Prior Art

An OLED display is a device of the new generation. An organic thin film is produced on an OLED substrate. The organic thin film is arranged on metal between the cathode and the anode. When voltage is imposed on the cathode and the anode, the organic thin film will be illuminated. The organic thin film is very sensitive to water vapor and oxygen. Water vapor and oxygen easily causes the organic thin film to age and deteriorate, thereby causing the brightness and lifetime of the OLED device to get worse obviously. That's why the OLED device needs to be packaged. A conventional method for packaging the OLED device is that: an ultraviolet (UV) glue is coated on edges of a package cover, and then the package cover and the OLED substrate as a pair are cemented. Two glass substrate and a support formed by the UV glue form an enclosed space, and the organic thin film is placed in the enclosed space. However, the support formed by the UV glue is quite poorer for blocking off water vapor and oxygen. It is quite easy for water vapor and oxygen to seep into the enclosed space through glue frames, thereby affecting performance of the organic thin film.

SUMMARY OF THE INVENTION

An object of the present invention is to propose an OLED display panel and a method for packaging the same for effectively preventing external water vapor and oxygen from entering the enclosed space of the OLED device so that an organic thin-film cannot be affected. In this way, the effect of package is enhanced, and the lifetime of the OLED device is prolonged.

According to the present invention, a method for packaging an organic light-emitting diode (OLED) display panel comprises: providing a package cover and an OLED substrate, and an OLED device arranged on OLED substrate; simultaneously printing a circle of a support and a hydrophobic barricade on an outer side of the package cover corresponding to the OLED device by means of screen printing, the support printed on an outer side of the hydrophobic barricade, and a width of the hydrophobic barricade being 100 um to 2000 um; cementing the package cover and the OLED substrate. A step of simultaneously printing a circle of the support and the hydrophobic barricade by means of screen printing comprises steps of: providing a template of screen printing comprising two patterned apertures, and shapes of the two patterned apertures matching shapes of the support and the hydrophobic barricade, respectively; arranging material for forming the support and material for forming the hydrophobic barricade on the template of screen printing; scratching the template of screen printing with a scraper, and blade-coating the materials forming the support and the hydrophobic barricade on the apertures corresponding to the template of screen printing.

In one aspect of the present invention, the hydrophobic barricade is made from a solution, and after the package cover and the OLED substrate are cemented, steps further comprise: shining and solidifying the material for forming the support with ultraviolet (UV) rays; and drying the solidified support and the solidified solution.

In another aspect of the present invention, the solution is a solution with organic silicon, and the solution with the organic silicon comprises a long chain silane coupling agent and vinyltriethoxysilane (VTES).

In yet another aspect of the present invention, the solution is made from an organic solution and an inorganic compound solution where the organic solution comprises solution using silicon alkoxide, titanium alkoxide, tin alkoxide, aluminum alkoxide or zirconium alkoxide as a precursor.

According to the present invention, a method for packaging an organic light-emitting diode (OLED) display panel comprises: providing a package cover and an OLED substrate, and an OLED device arranged on OLED substrate; simultaneously printing a circle of a support and a hydrophobic barricade on an outer side of the package cover corresponding to the OLED device by means of screen printing, the support printed on an outer side of the hydrophobic barricade; and cementing the package cover and the OLED substrate.

In one aspect of the present invention, a step of simultaneously printing a circle of the support and the hydrophobic barricade by means of screen printing comprises steps of: providing a template of screen printing comprising two patterned apertures, and shapes of the two patterned apertures matching shapes of the support and the hydrophobic barricade, respectively; arranging material for forming the support and material for forming the hydrophobic barricade on the template of screen printing; scratching the template of screen printing with a scraper, and blade-coating the materials forming the support and the hydrophobic barricade on the apertures corresponding to the template of screen printing.

In another aspect of the present invention, the hydrophobic barricade is made from a solution, and after the package cover and the OLED substrate are cemented, steps further comprise: shining and solidifying the material for forming the support with ultraviolet (UV) rays; and drying the solidified support and the solidified solution.

In another aspect of the present invention, the solution is a solution with organic silicon, and the solution with the organic silicon comprises a long chain silane coupling agent and vinyltriethoxysilane (VTES).

In still another aspect of the present invention, the solution is made from an organic solution and an inorganic compound solution where the organic solution comprises solution using silicon alkoxide, titanium alkoxide, tin alkoxide, aluminum alkoxide or zirconium alkoxide as a precursor.

In yet another aspect of the present invention, a width of the hydrophobic barricade is 100 um to 2000 um.

According to the present invention, an organic light-emitting diode (OLED) display panel, comprises: an OLED substrate, and an OLED device arranged on the OLED substrate; a package cover; a hydrophobic barricade, arranged on an outer side of an OLED device corresponding to the package cover by means of screen printing, and the hydrophobic barricade enclosing the OLED device when the OLED substrate and the package cover are cementing; a support, arranged on an outer side of the hydrophobic barricade arranged on the package cover by means of screen printing, and the support enclosing the hydrophobic barricade.

In one aspect of the present invention, the solution is a solution with organic silicon, and the solution with the organic silicon comprises a long chain silane coupling agent and vinyltriethoxysilane (VTES).

In another aspect of the present invention, the solution is made from an organic solution and an inorganic compound solution where the organic solution comprises solution using silicon alkoxide, titanium alkoxide, tin alkoxide, aluminum alkoxide or zirconium alkoxide as a precursor.

In yet another aspect of the present invention, a width of the hydrophobic barricade is 100 um to 2000 um.

Compared with the conventional technology, the present invention proposes the method for printing a circle of a support and a hydrophobic barricade on an outer side of an OLED device by means of screen printing at the same time where the support is printed on an outer side of the hydrophobic barricade. The hydrophobic barricade can effectively prevent external water vapor and oxygen from touching the OLED device. Particularly, an organic thin film of the OLED device is prevented from being affected by external water vapor and oxygen. Therefore, the effect of package is enhanced, and the lifetime of the OLED device is prolonged. Further, the support and the hydrophobic barricade are formed at the same time through screen printing. Not only the method is simple but the efficiency is enhanced.

DETAILED DESCRIPTION OF THE PREFERRED EMBODIMENTS

Figure 1:
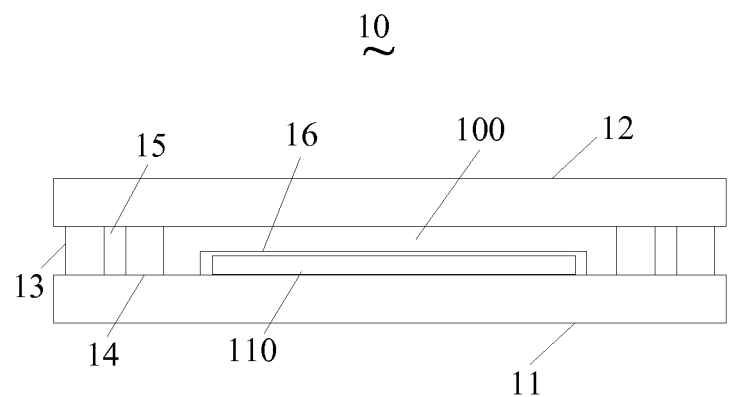
FIG. 1 is a schematic diagram of the structure of an OLED display panel according to an embodiment of the present invention.

Please refer to FIG. 1. FIG. 1 is a schematic diagram of the structure of an OLED display panel 10 according to an embodiment of the present invention. The OLED display panel 10 comprises an OLED substrate 11, a package cover 12, a support 13, and a hydrophobic barricade 14.

An OLED device 110 is disposed on the OLED substrate 11.

Figure 2:
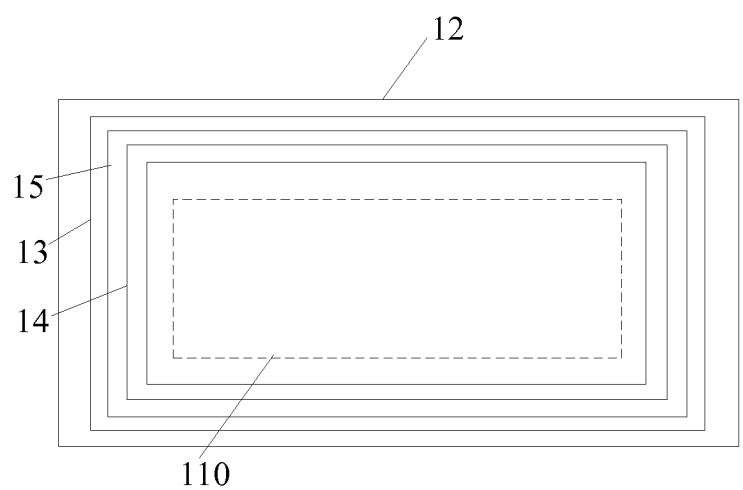
FIG. 2 is a schematic diagram of the structure of the package cover.

Please refer to FIG. 2. FIG. 2 is a schematic diagram of the structure of the package cover 12. The hydrophobic barricade 14 is printed on an outer side of the package cover 12 which the OLED device 110 corresponds to by means of screen printing. The OLED device 110 is enclosed by the hydrophobic barricade 14 when the OLED substrate 11 and the package cover 12 are cemented. The support 13 is printed on an outer side of the hydrophobic barricade 14 disposed on the package cover 12 by means of screen printing. The hydrophobic barricade 14 is enclosed by the support 13. Both of the support 13 and the hydrophobic barricade 14 are formed by means of screen printing at the same time.

Please refer to FIG. 1. The OLED substrate 11 and the package cover 12 are disposed opposite. The support 13 and the hydrophobic barricade 14 are disposed on an area between the OLED substrate 11 and the package cover 12 in which the support 13 is as tall as the hydrophobic barricade 14, and the space between the OLED substrate 11 and the package cover 12 is enclosed by the support 13 and the hydrophobic barricade 14 and becomes an enclosed space 100. Therefore, the hydrophobic barricade 14 can effectively prevent external water vapor and oxygen from entering the enclosed space 100 of the OLED device 110 so that an organic thin-film of the OLED device 110 cannot be affected by external water vapor and oxygen. In this way, the effect of package is enhanced, and the lifetime of the OLED device 110 is prolonged.

The hydrophobic barricade 14 is disposed on the inside of the support 13. Such an arrangement prevents the hydrophobic barricade 14 from being corroded and oxidized by external water vapor and oxygen. It helps prolong the lifetime of the hydrophobic barricade 14.

Both of the support 13 and the hydrophobic barricade 14 are formed by means of screen printing. The method is simple. It does not need so many devices, either. The costs for the present invention are lower.

The support 13 and the hydrophobic barricade 14 are formed at the same time. Therefore, it reduces time to produce the support 13 and the hydrophobic barricade 14, thereby increasing efficiency.

The support 13 is made from glue or glass. The hydrophobic barricade 14 is made from a solution. The solution may have two types:

Type 1: The solution comprises organic silicon. The solution with the organic silicon is formed by precursor comprising a stronger hydrophobic side chain. Preferably, the solution with the organic silicon comprises a long chain silane coupling agent and vinyltriethoxysilane (VTES).

Type 2: The solution is made from an organic solution and an inorganic compound solution where the organic solution comprises solution using silicon alkoxide, titanium alkoxide, tin alkoxide, aluminum alkoxide or zirconium alkoxide as a precursor.

The width of the hydrophobic barricade 14 is preferably 100 um to 2000 um in this embodiment.

Further, a water heat release layer 15 is arranged on the inner side of the support 13 and the inner side of the hydrophobic barricade 14 in this embodiment. The water heat release layer 15 releases a lot of heat after touching water vapor. The water heat release layer 15 is fabricated from either sodium (Na) or magnesium (Mg). It depend on the melting point of the support 13 and the melting point of the hydrophobic barricade 14 to decide the material of the water heat release layer 15.

The OLED display panel 10 is packaged in a vacuumed environment. The water heat release layer 15 does not react with oxygen in this embodiment, so the water heat release layer 15 can be arranged on places where the support 13 and the hydrophobic barricade 14 are predetermined arranged. Cracks or bubbles may appear on the support 13 and the hydrophobic barricade 14 whenever the OLED display panel 10 has been used for a period of time or the OLED display panel 10 is not packaged to an ideal state. Accordingly, external water vapor may enter the enclosed space 100 of the OLED display panel 10. The water heat release layer 15 releases a lot of heat after touching water vapor so that the support 13 and the hydrophobic barricade 14 can reach a molten state again. The material for forming the support 13 and the material for forming the hydrophobic barricade 14 have a feature of a certain degree of liquidity. Such materials with liquidity refill and seal the cracks or any other sections which water vapor can pass. Since the OLED display panel 10 has a function of automatic recovery, the lifetime of the OLED device 110 is prolonged.

The OLED display panel 10 further comprises a moisture barrier 16. The moisture barrier 16 is used for preventing external water vapor from affecting the organic thin film in the OLED device 110. To be specific, the moisture barrier 16 is sprayed on the OLED device 110. Plus, the moisture barrier 16 covers the OLED substrate 11 totally or covers the OLED device 110 only. Preferably, the moisture barrier 16 is a desiccant thin film. The desiccant can be a desiccant with chemisorption or physisorption. So the OLED device 110 is waterproof further.

Figure 3:
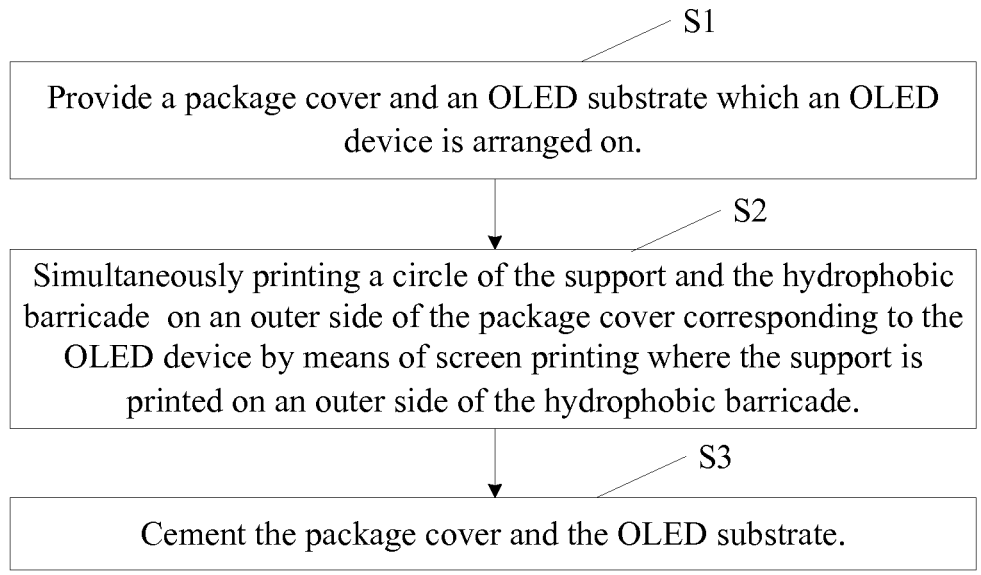
FIG. 3 is a flow chart of a method for packaging an OLED display panel according to a preferred embodiment of the present invention.

Further, a method for packaging an OLED display panel is proposed by the embodiment of the present invention. The OLED display panel here is the above-mentioned OLED display panel 10. Please refer to FIG. 3. FIG. 3 is a flow chart of the method for packaging the OLED display panel 10 proposed by the embodiment of the present invention. As FIGS. 1-3 show, the method for packaging the OLED display panel 10 comprises following steps of:

Step S1: Providing a package cover 12 and an OLED substrate 11 which an OLED device 110 is arranged on.

Further, the OLED device 110 arranged on the OLED substrate 11 is electrified for burning remaining particles on the OLED device 110 after the OLED device 110 is arranged on the OLED substrate 11. Specific steps are as follows:

First, the OLED substrate 11 is arranged on an evaporation deposition cavity which is highly vacuumed. The OLED substrate 11 completes evaporation and deposition. Then, the OLED substrate 11 is retrieved and electrified for a predetermined period of time. There are two stages for the process of electrification, and to be specific, constant direct current for one minute and variant voltage scanning for one minute. The process of constant direct current is that: the OLED device 110 is electrified for 30 seconds with seven voltages (7V), and then the OLED device 110 continues being applied for 30 seconds with −15 voltages (−15V). The process of variant voltage scanning is that: the OLED device 110 is electrified for 40 seconds with −15 voltages (−15V) to 10 voltages (10V), and then the OLED device 110 is electrified for 40 seconds with one voltage (1V), which is a circle. The circle conducts consecutively for five times. Afterwards, the OLED device 110 is electrified for 20 seconds with zero voltage (0V) to seven voltages (7V), and then the OLED device 110 is electrified for 20 seconds with one voltage (1V), which is a circle. The circle conducts consecutively for ten times.

After undergoing the process of electrification, the OLED device 110 is effectively improved. Shortcut occurs less for the OLED device 110 due to remaining particles on the OLED device 110. Thereby, a high yield rate for the OLED device 110 is enhanced. The stability of the OLED device 110 improves as well.

Step S2: Simultaneously printing a circle of the support 13 and the hydrophobic barricade 14 on an outer side of the package cover 12 corresponding to the OLED device 110 by means of screen printing where the support 13 is printed on an outer side of the hydrophobic barricade 14.

Figure 4:
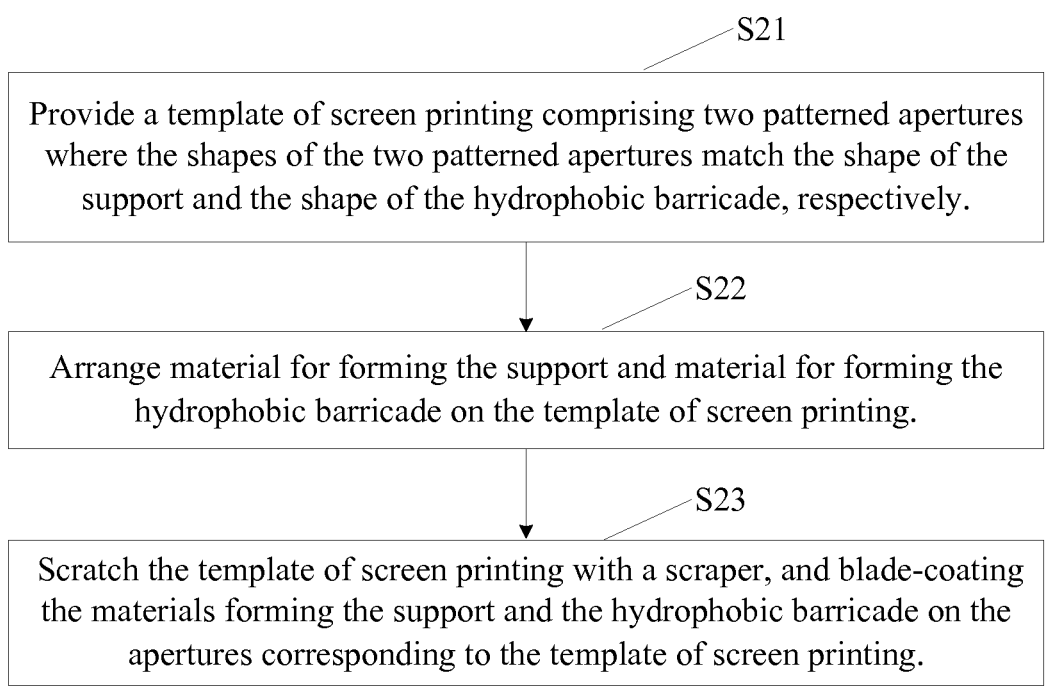
FIG. 4 is a flow chart of a method for packaging an OLED display panel according to another preferred embodiment of the present invention.

Please refer to FIG. 4. FIG. 4 is a flow chart of a method for FIG. 2 in the present invention. The specific method comprises following steps of:

Step S21: Providing a template of screen printing comprising two patterned apertures where the shapes of the two patterned apertures match the shape of the support 13 and the shape of the hydrophobic barricade 14, respectively.

Step S22: Arranging material for forming the support 13 and material for forming the hydrophobic barricade 14 on the template of screen printing.

Step S23: Scratching the template of screen printing with a scraper, and blade-coating the materials forming the support 13 and the hydrophobic barricade 14 on the apertures corresponding to the template of screen printing.

The support 13 is made from glue or glass. The hydrophobic barricade 14 is made from solution. There are two types for the solution:

Type 1: The solution comprises organic silicon. The solution with the organic silicon is formed by precursor comprising a stronger hydrophobic side chain. Preferably, the solution with the organic silicon comprises a long chain silane coupling agent and VTES.

Type 2: The solution is made from an organic solution and an inorganic compound solution where the organic solution comprises solution using silicon alkoxide, titanium alkoxide, tin alkoxide, aluminum alkoxide or zirconium alkoxide as a precursor.

Step S3: Cementing the package cover 12 and the OLED substrate 11.

After Step S3, the glue material used for forming the support 13 is shined and solidified with UV rays further. Specifically, a mask plate is used for blocking out all of the places except the support 13. The place where the support 13 is not blocked off, and instead, is exposed with UV rays. Thus, the support 13 is solidified.

After the support 13 is shined and solidified with UV rays, the support 13 and the solution for forming the hydrophobic barricade 14 are dried so that the support 13 and the hydrophobic barricade 14 can enclose the space between the package cover 12 and the OLED substrate 11. An enclosed space 100 is thus formed. The width of the hydrophobic barricade 14 is between 100 um and 2000 um.

Screen printing only requires two steps—coating and drying. It shows the techniques are simple to arrange the support 13 and the hydrophobic barricade 14.

Only a template of screen printing, a scraper, and a drying device are needed in screen printing so costs are lower.

The efficiency of the present invention increases since the support 13 and the hydrophobic barricade 14 undergo screen printing at the same time.

Further, a water heat release layer 15 is arranged on the inner side of the support 13 and the inner side of the hydrophobic barricade 14 in Step S2 of the embodiment. The water heat release layer 15 releases a lot of heat after touching water vapor. The water heat release layer 15 is fabricated from either natrium or magnesium. It is understood that the water heat release layer 15 may be also fabricated from other materials. It depend on the melting point of the support 13 and the melting point of the hydrophobic barricade 14 to decide the material of the water heat release layer 15.

The OLED display panel 10 is packaged in a vacuumed environment. The water heat release layer 15 does not react with oxygen in this embodiment, so the water heat release layer 15 can be successfully arranged on places where the support 13 and the hydrophobic barricade 14 are predetermined arranged. Cracks or bubbles may appear on the support 13 and the hydrophobic barricade 14 whenever the OLED display panel 10 has been used for a period of time or the OLED display panel 10 is not packaged to an ideal state. Accordingly, external water vapor may enter the enclosed space 100 of the OLED display panel 10. The water heat release layer 15 releases a lot of heat after touching water vapor so that the support 13 and the hydrophobic barricade 14 can reach a molten state again. The material for forming the support 13 and the material for forming the hydrophobic barricade 14 have a feature of a certain degree of liquidity. Such materials with liquidity refill and seal the cracks or any other sections which water vapor can pass. Since the OLED display panel 10 has a function of automatic recovery, the lifetime of the OLED device 110 is prolonged.

In Step S1, further, a moisture barrier 16 is formed on the the OLED substrate 11 by means of spraying in order to prevent external water vapor from affecting the organic thin film of the OLED device 110. Specifically, the moisture barrier 16 is sprayed on the OLED device 110 after the OLED device 110 is arranged on the OLED substrate 11. Plus, the moisture barrier 16 covers the OLED substrate 11 totally or covers the OLED device 110 only. Preferably, the moisture barrier 16 is a desiccant thin film. The desiccant can be a desiccant with chemisorption or physisorption. So the OLED device 110 is waterproof further. Because the moisture barrier 16 is formed by means of spraying in the present invention, the method proposed by this embodiment of the present invention is simpler and quicker compared with the conventional technique where chemical vapor deposition (CVD) is adopted. Thereby, the efficiency of package of the OLED device 110 is enhanced.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A method for packaging an organic light-emitting diode (OLED) display panel, comprising:
    providing a package cover and an OLED substrate, and an OLED device arranged on OLED substrate;
    simultaneously printing a circle of a support and a hydrophobic barricade on an outer side of the package cover corresponding to the OLED device by means of screen printing, the support printed on an outer side of the hydrophobic barricade; and
    cementing the package cover and the OLED substrate.

2. The method of claim 1, wherein a step of simultaneously printing a circle of the support and the hydrophobic barricade by means of screen printing comprises steps of:
    providing a template of screen printing comprising two patterned apertures, and shapes of the two patterned apertures matching shapes of the support and the hydrophobic barricade, respectively;
    arranging material for forming the support and material for forming the hydrophobic barricade on the template of screen printing;
    scratching the template of screen printing with a scraper, and blade-coating the materials forming the support and the hydrophobic barricade on the apertures corresponding to the template of screen printing.

3. The method of claim 2, wherein the hydrophobic barricade is made from a solution, and after the package cover and the OLED substrate are cemented, steps further comprise:
    shining and solidifying the material for forming the support with ultraviolet (UV) rays; and
    drying the solidified support and the solidified solution.

4. The method of claim 3, wherein the solution is a solution with organic silicon, and the solution with the organic silicon comprises a long chain silane coupling agent and vinyltriethoxysilane (VTES).

5. The method of claim 3, wherein the solution is made from an organic solution and an inorganic compound solution where the organic solution comprises solution using silicon alkoxide, titanium alkoxide, tin alkoxide, aluminum alkoxide or zirconium alkoxide as a precursor.

6. The method of claim 1, wherein a width of the hydrophobic barricade is 100 um to 2000 um.

7. A method for packaging an organic light-emitting diode (OLED) display panel, comprising:
    providing a package cover and an OLED substrate, and an OLED device arranged on OLED substrate;
    simultaneously printing a circle of a support and a hydrophobic barricade on an outer side of the package cover corresponding to the OLED device by means of screen printing, the support printed on an outer side of the hydrophobic barricade, and a width of the hydrophobic barricade being 100 um to 2000 um;
    cementing the package cover and the OLED substrate;
    a step of simultaneously printing a circle of the support and the hydrophobic barricade by means of screen printing comprising steps of:
    providing a template of screen printing comprising two patterned apertures, and shapes of the two patterned apertures matching shapes of the support and the hydrophobic barricade, respectively;
    arranging material for forming the support and material for forming the hydrophobic barricade on the template of screen printing;
    scratching the template of screen printing with a scraper, and blade-coating the materials forming the support and the hydrophobic barricade on the apertures corresponding to the template of screen printing.

8. The method of claim 7, wherein the hydrophobic barricade is made from a solution, and after the package cover and the OLED substrate are cemented, steps further comprise:
    shining and solidifying the material for forming the support with ultraviolet (UV) rays; and
    drying the solidified support and the solidified solution.

9. The method of claim 8, wherein the solution is a solution with organic silicon, and the solution with the organic silicon comprises a long chain silane coupling agent and vinyltriethoxysilane (VTES).

10. The method of claim 8, wherein the solution is made from an organic solution and an inorganic compound solution where the organic solution comprises solution using silicon alkoxide, titanium alkoxide, tin alkoxide, aluminum alkoxide or zirconium alkoxide as a precursor.

* * * * *